US 9,695,508 B2

(12) United States Patent
Carlson et al.

(10) Patent No.: US 9,695,508 B2
(45) Date of Patent: Jul. 4, 2017

(54) LINER ASSEMBLY FOR CHEMICAL VAPOR DEPOSITION CHAMBER

(71) Applicant: Applied Materials, Inc., Santa Clara, CA (US)

(72) Inventors: David K. Carlson, San Jose, CA (US); Mehmet Tugrul Samir, Mountain View, CA (US); Nyi O. Myo, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 354 days.

(21) Appl. No.: 14/639,697

(22) Filed: Mar. 5, 2015

(65) Prior Publication Data

US 2015/0176123 A1 Jun. 25, 2015

Related U.S. Application Data

(62) Division of application No. 13/193,570, filed on Jul. 28, 2011, now Pat. No. 8,980,005.

(Continued)

(51) Int. Cl.
*C23C 16/458* (2006.01)
*C23C 16/44* (2006.01)
(Continued)

(52) U.S. Cl.
CPC .... *C23C 16/4404* (2013.01); *C23C 16/45574* (2013.01); *C23C 16/45578* (2013.01)

(58) Field of Classification Search
CPC .......... C23C 16/4404; C23C 16/45574; C23C 16/45578; C23C 18/1621; C23C 18/1626; A01B 12/006

(Continued)

(56) References Cited

U.S. PATENT DOCUMENTS 4,976,996 A * 12/1990 Monkowski .......... C23C 16/455
118/719
5,551,982 A * 9/1996 Anderson ............. C23C 16/455
118/715

(Continued)

FOREIGN PATENT DOCUMENTS

JP 2000277509 A 10/2000
JP 2001-517736 B1 10/2001

(Continued)

OTHER PUBLICATIONS

Taiwan Office Action and Search Report for Application No. 100126647 dated Nov. 20, 2015.

*Primary Examiner* — Rudy Zervigon
(74) *Attorney, Agent, or Firm* — Patterson + Sheridan, LLP

(57) ABSTRACT

Embodiments described herein relate to an apparatus and method for lining a processing region within a chamber. In one embodiment, a modular liner assembly for a substrate processing chamber is provided. The modular liner assembly includes a first liner and a second liner, each of the first liner and second liner comprising an annular body sized to be received in a processing volume of a chamber, and at least a third liner comprising a body that extends through the first liner and the second liner, the third liner having a first end disposed in the process volume and a second end disposed outside of the chamber.

20 Claims, 13 Drawing Sheets

Related U.S. Application Data

(60) Provisional application No. 61/466,413, filed on Mar. 22, 2011.

(51) Int. Cl.
*C23F 1/00* (2006.01)
*H01L 21/306* (2006.01)
*C23C 16/455* (2006.01)
*C23C 16/06* (2006.01)

(58) Field of Classification Search
USPC ........................................ 118/715; 156/345.3
See application file for complete search history.

(56) References Cited

U.S. PATENT DOCUMENTS

| | | | |
|---|---|---|---|
| 5,597,439 A | 1/1997 | Salzman | |
| 5,914,050 A * | 6/1999 | Comita | C23C 16/4401 118/715 |
| 5,916,369 A * | 6/1999 | Anderson | C23C 16/455 118/715 |
| 6,099,651 A * | 8/2000 | Sajoto | C23C 16/4401 118/715 |
| 6,153,260 A * | 11/2000 | Comita | C23C 16/4408 118/719 |
| 6,500,734 B2 * | 12/2002 | Anderson | C23C 16/45504 438/478 |
| 7,709,391 B2 * | 5/2010 | Kuppurao | C23C 16/452 438/706 |
| 7,794,667 B2 * | 9/2010 | Nishikawa | C23C 16/4409 422/129 |
| 7,976,634 B2 * | 7/2011 | Carlson | C23C 16/22 118/724 |
| 8,118,938 B2 * | 2/2012 | Carducci | H01J 37/32082 118/50 |
| 8,147,137 B2 * | 4/2012 | Patalay | H01L 21/67248 118/725 |
| 8,216,377 B2 * | 7/2012 | Derderian | C23C 16/08 118/715 |
| 8,236,105 B2 * | 8/2012 | Bera | C23C 16/4412 118/715 |
| 8,282,736 B2 * | 10/2012 | Carducci | H01J 37/32082 118/50 |
| 8,343,317 B2 * | 1/2013 | Carlson | C23C 16/4412 134/1 |
| 8,366,827 B2 * | 2/2013 | Seo | C23C 16/44 118/715 |
| 8,382,939 B2 * | 2/2013 | Kutney | H01J 37/3244 118/50 |
| 8,435,886 B2 * | 5/2013 | Derderian | C23C 16/08 118/715 |
| 8,663,390 B2 * | 3/2014 | Carlson | C23C 16/22 118/724 |
| 8,691,015 B2 * | 4/2014 | Derderian | C23C 16/08 118/715 |
| 2002/0020358 A1 * | 2/2002 | Hey | C23C 16/44 118/725 |
| 2004/0050325 A1 * | 3/2004 | Samoilov | C23C 16/45561 118/715 |
| 2005/0277272 A1 * | 12/2005 | Singh | C23C 16/482 438/479 |
| 2007/0113783 A1 * | 5/2007 | Lee | C23C 16/4404 118/715 |
| 2007/0170148 A1 * | 7/2007 | Kuppurao | C23C 16/452 216/58 |
| 2007/0281084 A1 * | 12/2007 | Hirosawa | C23C 16/45565 427/248.1 |
| 2008/0210163 A1 * | 9/2008 | Carlson | C23C 16/22 118/715 |
| 2008/0220150 A1 * | 9/2008 | Merry | C23C 16/45591 427/8 |
| 2008/0274604 A1 * | 11/2008 | Sanchez | C23C 16/4581 438/507 |
| 2009/0188625 A1 * | 7/2009 | Carducci | H01J 37/32467 156/345.34 |
| 2009/0274454 A1 * | 11/2009 | Aderhold | H01L 21/324 392/416 |
| 2009/0276097 A1 * | 11/2009 | Patalay | C30B 25/12 700/279 |
| 2010/0272892 A1 * | 10/2010 | Kobayashi | C23C 16/45574 427/255.5 |
| 2011/0024048 A1 * | 2/2011 | Nakamura | H01J 37/32091 156/345.51 |
| 2011/0162803 A1 * | 7/2011 | Palagashvili | H01J 37/32091 156/345.54 |
| 2012/0240853 A1 * | 9/2012 | Carlson | C23C 16/4404 118/715 |
| 2012/0258259 A1 * | 10/2012 | Bansal | C23C 16/0272 427/558 |
| 2013/0087286 A1 * | 4/2013 | Carducci | H05H 1/46 156/345.43 |
| 2014/0116336 A1 * | 5/2014 | Brillhart | B05B 1/005 118/715 |
| 2014/0224174 A1 * | 8/2014 | Abedijaberi | C23C 16/45563 118/715 |
| 2014/0261185 A1 * | 9/2014 | Aboagye | C23C 16/4411 118/728 |
| 2014/0322897 A1 * | 10/2014 | Samir | H01L 21/67017 438/478 |
| 2014/0326185 A1 * | 11/2014 | Lau | C23C 16/45563 118/728 |

FOREIGN PATENT DOCUMENTS

| | | |
|---|---|---|
| KR | 10-2003-0070374 B2 | 8/2003 |
| KR | 10-2009-0062720 B3 | 6/2009 |
| TW | 200947585 A | 11/2009 |

* cited by examiner

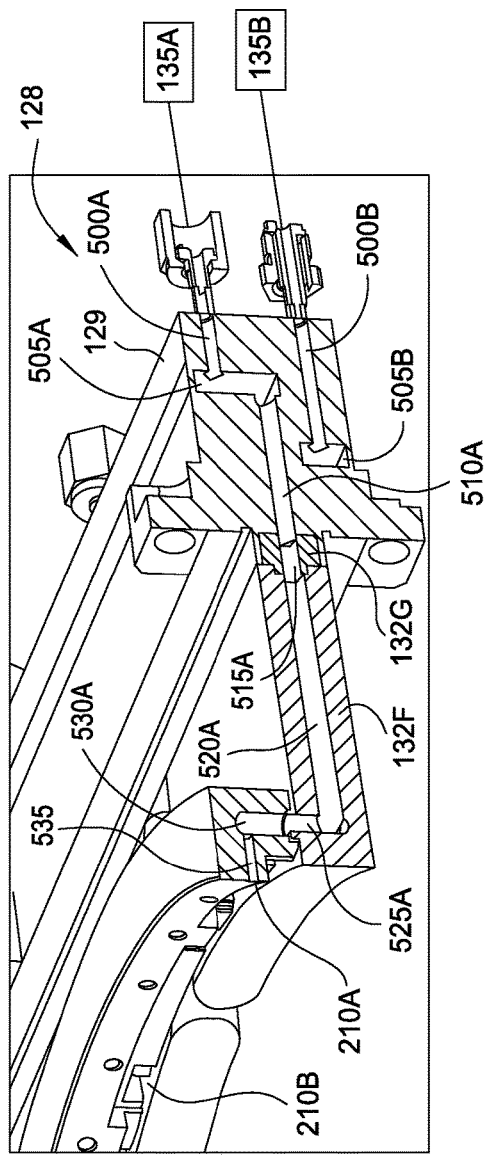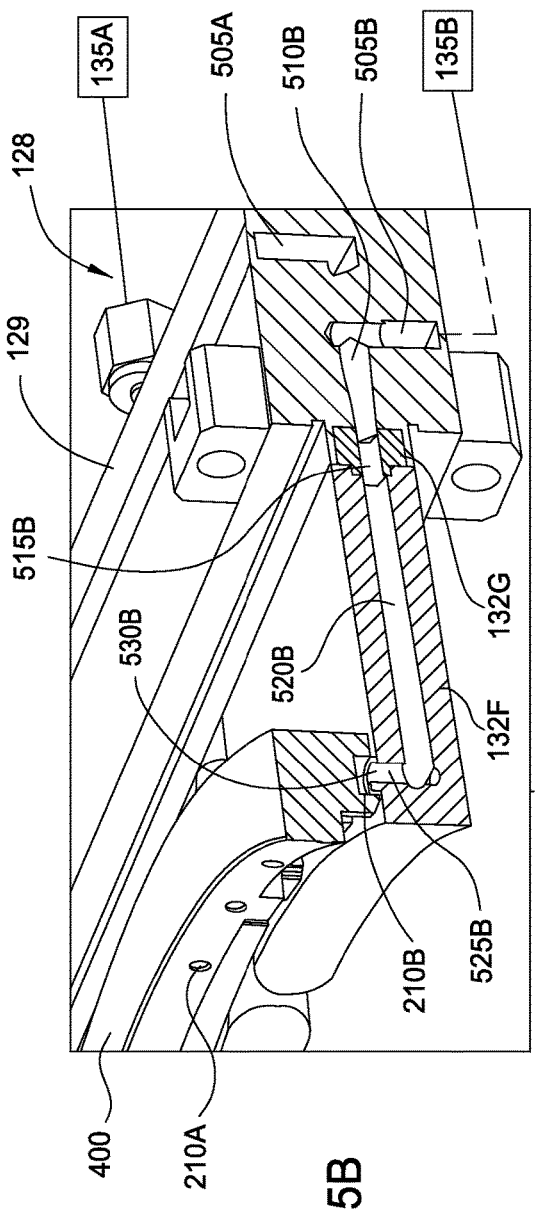

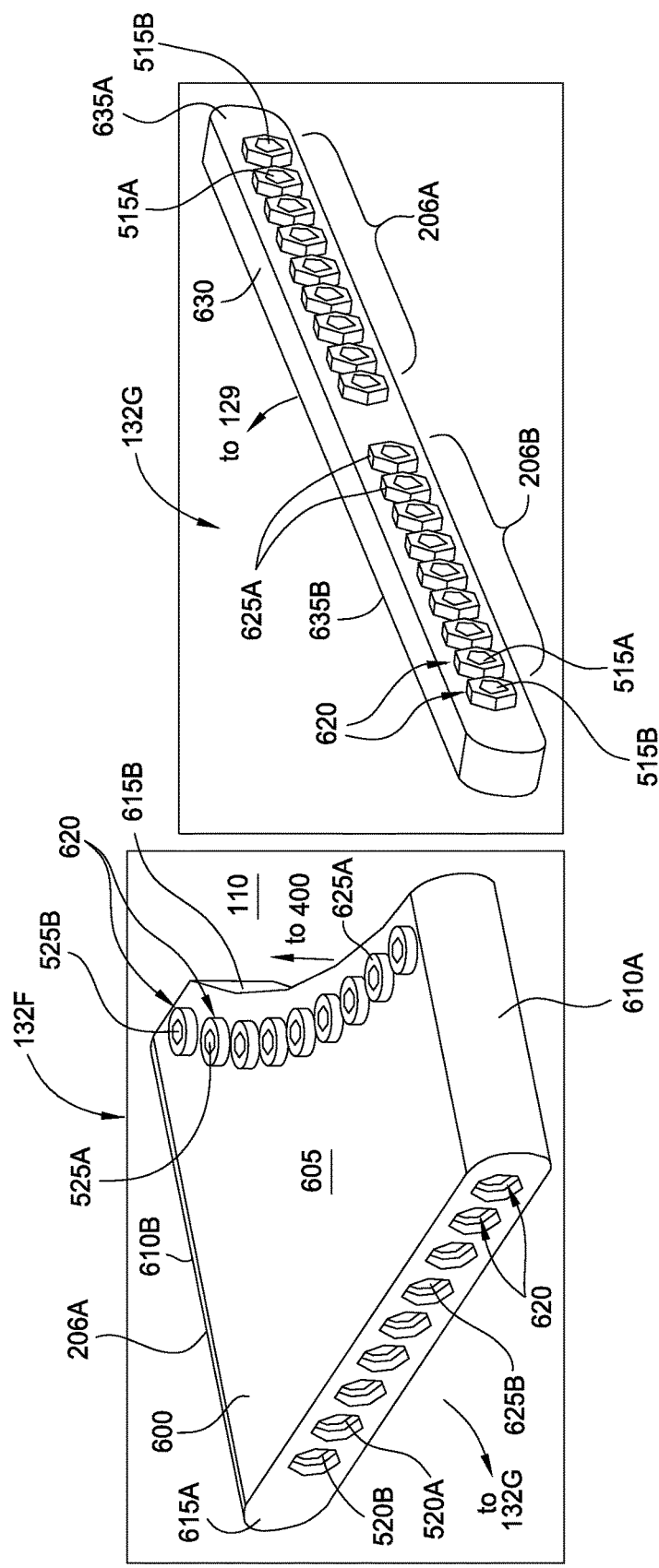

LINER ASSEMBLY FOR CHEMICAL VAPOR DEPOSITION CHAMBER

CROSS-REFERENCE TO RELATED APPLICATIONS

This application is a divisional of U.S. patent application Ser. No. 13/193,570, filed Jul. 28, 2011 and issued as U.S. Pat. No. 8,980,005 on Mar. 17, 2015, which application claims benefit of U.S. Provisional Patent Application Ser. No. 61/466,413, filed Mar. 22, 2011, both of which are hereby incorporated by reference herein.

BACKGROUND OF THE INVENTION

Field of the Invention

Embodiments of the present invention generally relate to a modular liner assembly utilized in a deposition chamber for semiconductor fabrication processes.

Description of the Related Art

Epitaxial growth of silicon-containing films has become increasingly important due to new applications for advanced logic and DRAM devices, among other devices. A key requirement for these applications is a lower temperature/low pressure process so that device features will not be damaged during fabrication of the device. Selective and blanket (e.g., non-selectively grown) epitaxial films containing silicon, and strained embodiments of such epitaxial films, which are grown at temperatures of a maximum of about 900 degrees C. to less than about 700 degrees C., are required for many current semiconductor applications. This lower temperature processing is not only important to forming a properly functioning device, but it minimizes or prevents the relaxation of metastable strain layers, helps to prevent or minimize dopant diffusion, and helps to minimize segregation of dopant within the epitaxial film structure. Suppression of facet formation and short channel effects, which is enabled by low temperature processing (i.e., low thermal budget processing), is a significant factor for obtaining high performance devices.

In a typical LPCVD process to deposit an epitaxial layer on a substrate, precursors are injected into a processing region in a chamber by a gas distribution assembly, and the precursors are energized above the surface of a substrate in the chamber by irradiation of the precursors in the processing region, which is typically low wavelength radiation, such as in the ultraviolet and/or infrared spectrum. Plasma generation may also be used to dissociate the reactants. To enable a more efficient precursor dissociation process, it is desirable to preheat the precursors prior to delivery to the processing region to enable faster and more efficient dissociation of the precursors above the substrate. However, the chamber body surrounding the processing region and the precursor inject region is fabricated from a metallic material such as stainless steel, and some of the precursors utilized in the LPCVD processes are reactive with these metallic materials. Thus, these metallic materials are potential sources for contamination that could damage chamber components as well as produce particulate contamination on the substrate.

To prevent unwanted reactions with the chamber body, liners have been utilized to shield some of the metallic chamber components from the processing region. However, the conventional liners are expensive to produce and replacement is difficult and time-consuming. Further, the conventional liners fail to perform satisfactorily with newer prescribed allowable contamination levels. Additionally, the conventional liners are used for shielding chamber components and are not typically utilized to provide different precursor inject and/or exhaust schemes. Further, the conventional liners are not modular components that facilitate ease of replacement of one or more liners for use with existing liners. In some cases, replacement of one conventional liner component requires fabrication of entirely new liner components. All of these factors may contribute to device contamination and/or cause significant chamber downtime, which increase cost of ownership of the tool and the devices produced therein.

Therefore, there is a need for an apparatus and method for a liner assembly that may be easily replaced and configured for different processes without significant downtime of the chamber, thus reducing cost of ownership.

SUMMARY OF THE INVENTION

Embodiments described herein relate to an apparatus and method for lining a processing region within a chamber. In one embodiment, a modular liner assembly for a substrate processing chamber is provided. The modular liner assembly includes a first liner and a second liner, each of the first liner and second liner comprising an annular body sized to be received in a processing volume of a chamber, and at least a third liner comprising a body that extends through the first liner and the second liner, the third liner having a first end disposed in the process volume and a second end disposed outside of the chamber.

In another embodiment, a modular liner assembly for a substrate processing chamber is provided. The modular liner assembly includes a first liner and a second liner, each of the first liner and second liner comprising an annular body having a plurality of recessed portions formed therein, and at least a third liner comprising a body that is received in and at least partially contacts a portion of the plurality of recessed portions.

In another embodiment, a process kit for a semiconductor processing chamber is provided. The process kit includes a plurality of liners adapted to modularly couple to each other in a processing volume of a chamber. The plurality of liners comprise a first liner and a second liner, each of the first liner and second liner comprising an annular body having a plurality of recessed portions formed therein, and at least a third liner comprising a body that is received in and at least partially contacts a portion of the plurality of recessed portions.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 5A is an isometric cross-sectional view of the inject cap, the baffle liner, the inject insert liner assembly, and the gas distribution manifold liner of FIG. 4.

FIG. 5B is another isometric cross-sectional view of the inject cap, the baffle liner, the inject insert liner assembly, and the gas distribution manifold liner of FIG. 4.

FIG. 6A is an isometric view of a section of the inject insert liner assembly shown in FIG. 4.

FIG. 6B is an isometric view of the baffle liner of FIG. 4.

Figure 1A:
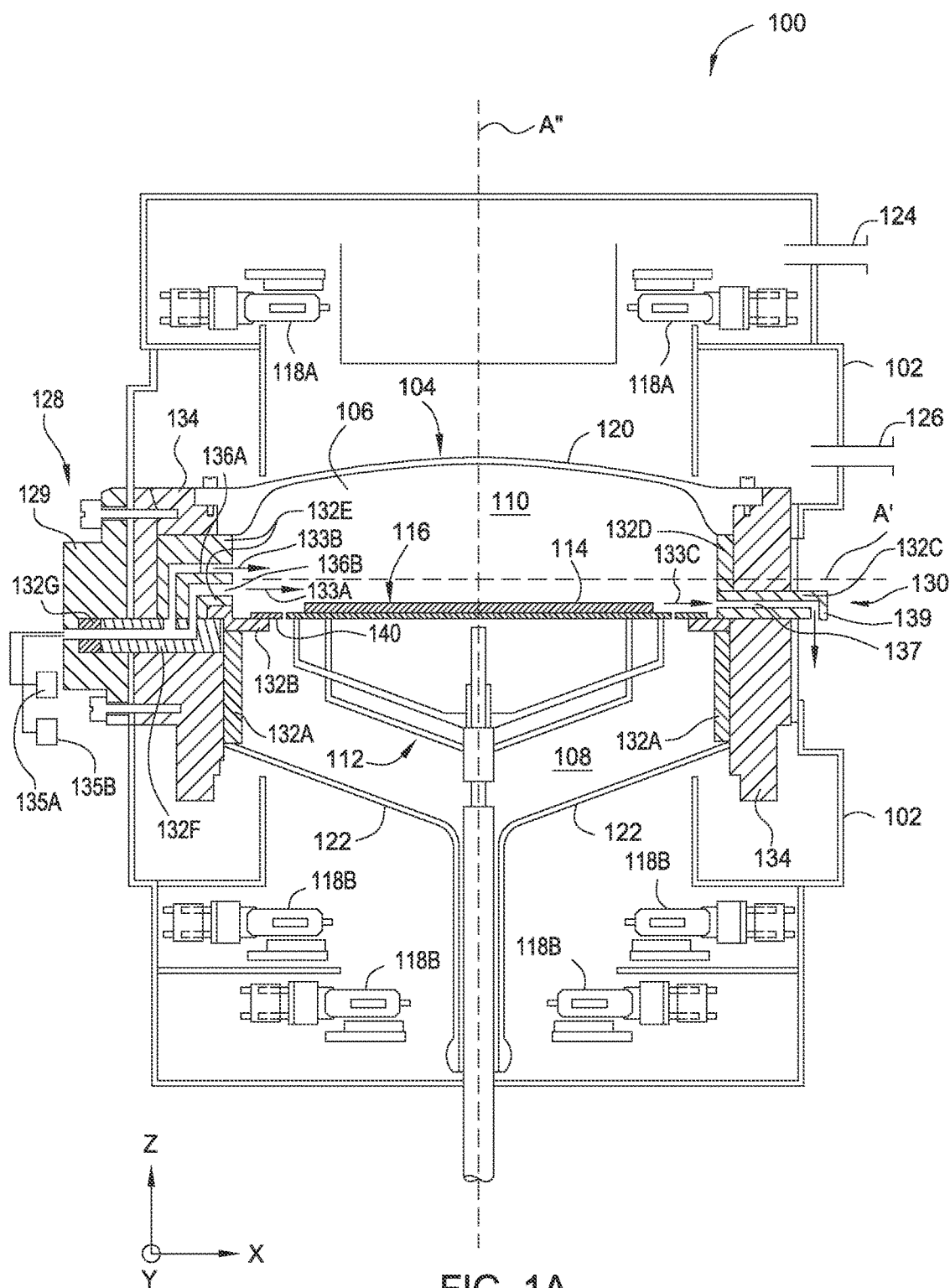
FIG. 1A is a schematic side cross-sectional view of a chamber according to embodiments described herein.

To facilitate understanding, identical reference numerals have been used, wherever possible, to designate identical elements that are common to the figures. It is also contemplated that elements disclosed in one embodiment may be beneficially utilized on other embodiments without specific recitation.

DETAILED DESCRIPTION

FIG. 1A is a schematic side cross-sectional view of a chamber 100. The chamber 100 is may be utilized for deposition, such as epitaxial deposition although the chamber 100 may be utilized for etching or other processes. The chamber 100 may be added to a CENTURA® integrated processing system available from Applied Materials, Inc., of Santa Clara, Calif. The chamber 100 includes housing structure 102 made of a process resistant material, such as aluminum or stainless steel, for example 316 L stainless steel. The housing structure 102 encloses various functioning elements of the process chamber 100, such as a quartz chamber 104, which includes an upper chamber 106, and a lower chamber 108, in which a processing volume 110 is contained. A substrate support 112, made of a ceramic material or a graphite material coated with a silicon material, such as silicon carbide, is adapted to receive a substrate 114 within the quartz chamber 104. Reactive species from precursor reactant materials are applied to a surface 116 of the substrate 114, and byproducts may be subsequently removed from the surface 116. Heating of the substrate 114 and/or the processing volume 110 may be provided by radiation sources, such as upper lamp modules 118A and lower lamp modules 118B. In one embodiment, the upper lamp modules 118A and lower lamp modules 118B are infrared lamps. Radiation from lamp modules 118A and 118B travels through an upper quartz window 120 of upper chamber 106, and through a lower quartz window 122 of lower chamber 108. Cooling gases for upper chamber 106, if needed, enter through an inlet 124 and exit through an outlet 126.

Reactive species are provided to the quartz chamber 104 by a gas distribution assembly 128, and processing byproducts are removed from processing volume 110 by an exhaust assembly 130, which is typically in communication with a vacuum source (not shown). Precursor reactant materials, as well as diluent, purge and vent gases for the chamber 100, enter through a gas distribution assembly 128 and exit through the exhaust assembly 130.

The chamber 100 also includes multiple liners 132A-132H (only liners 132A-132G are shown in FIG. 1). The liners 132A-132H shield the processing volume 110 from metallic walls 134 that surround the processing volume 110. The metallic walls 134 may be aluminum or stainless steel. The metallic walls 134 may react with precursors and cause contamination in the processing volume 110. In one embodiment, the liners 132A-132H comprise a process kit that covers all metallic components that may be in communication with or otherwise exposed to the processing volume 110.

A lower liner 132A is disposed in the lower chamber 108. An upper liner 132B is disposed at least partially in the lower chamber 108 and is adjacent the lower liner 132A. An exhaust insert liner assembly 132C is disposed adjacent the upper liner 1328. In FIG. 1, an exhaust insert liner 132D is disposed adjacent the exhaust insert liner assembly 132C and may replace a portion of the upper liner 132B to facilitate installation. An injector liner 132E is shown on the side of the processing volume 110 opposite the exhaust insert liner assembly 132C and the exhaust liner 132D. The injector liner 132E is configured as a manifold to provide one or more fluids, such as a gas or a plasma of a gas, to the processing volume 110. The one or more fluids are provided to the injector liner 132E by an inject insert liner assembly 132F. A baffle liner 132G is coupled to the inject insert liner assembly 132F. The baffle liner 132G is coupled to a first gas source 135A and an optional second gas source 135B and provides gases to the inject insert liner assembly 132F and to openings 136A and 1368 formed in the injector liner 132E.

The one or more gases are provided to the processing volume 110 from the first gas source 135A and the second gas source 135B through the baffle liner 132G, the inject insert liner assembly 132F and through the one or more openings 136A and 136B formed in the injector liner 132E. The one or more openings 136A and 136B formed in the injector liner 132E are coupled to outlets configured for a laminar flow path 133A or a jetted flow path 133B. Each of the flow paths 133A, 133B are configured to flow across an axis A' to the exhaust liner 132D. The axis A' is substantially normal to a longitudinal axis A" of the chamber 100. The flow paths 133A, 133B flow into a plenum 137 formed in the exhaust liner 132D and culminate in an exhaust flow path 133C. The plenum 137 is coupled to an exhaust or vacuum pump (not shown). In one embodiment, the plenum 137 is coupled to a manifold 139 that directs the exhaust flow path 133C in a direction that is substantially parallel to the longitudinal axis A". However, the manifold 139 may be adapted to direct the exhaust flow path 133C in a direction that is substantially parallel to the axis A'. At least the inject insert liner assembly 132F may be disposed through and partially supported by an inject cap 129. The inject cap 129 may be fabricated from a metallic material and coupled to the chamber 100 by one or more fasteners for easy removal and installation.

Figure 1B:
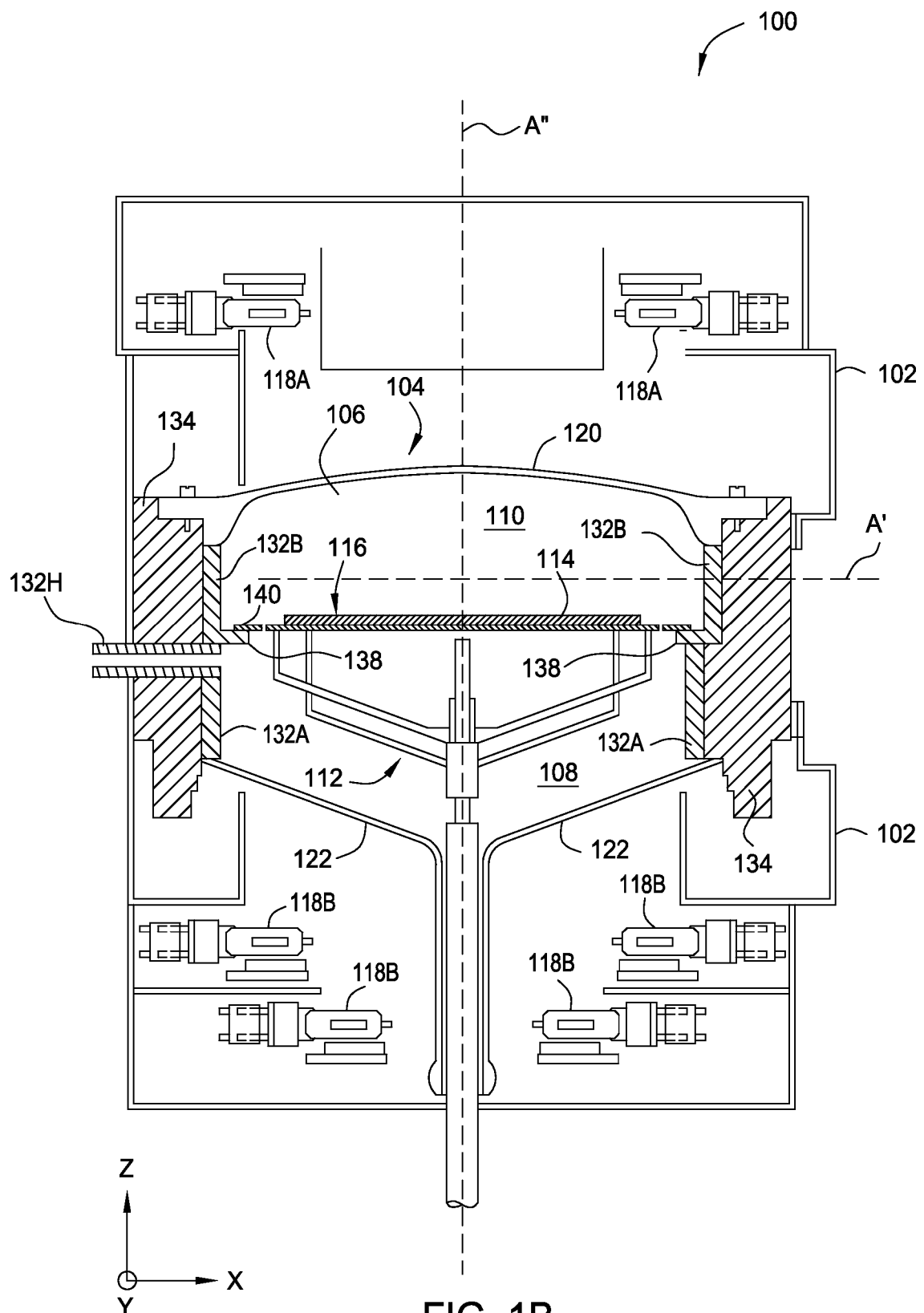
FIG. 1B is a schematic side cross-sectional view of the chamber of FIG. 1A rotated 90 degrees.

FIG. 1B is a schematic side cross-sectional view of the chamber 100 of FIG. 1A rotated 90 degrees. All components that are similar to the chamber 100 described in FIG. 1A will not be described for brevity. In FIG. 1B, a slit valve liner 132H is shown disposed through the metallic walls 134 of the chamber 100. Additionally, in the rotated view shown in FIG. 1B, the upper liner 132B is shown adjacent the lower liner 132A instead of the injector liner 132E shown in FIG. 1A. In the rotated view shown in FIG. 1B, the upper liner 132B is shown adjacent the lower liner 132A on the side of the chamber 100 opposite the slit valve liner 132H, instead of the exhaust liner 132D shown in FIG. 1A. In the rotated view shown in FIG. 1B, the upper liner 132B covers the metallic walls 134 of the upper chamber 106. The upper liner 132B also includes an inwardly extending shoulder 138. The inwardly extending shoulder 138 forms a lip that supports an annular pre-heat ring 140 that confines precursor gases in the upper chamber 106.

Figure 2:
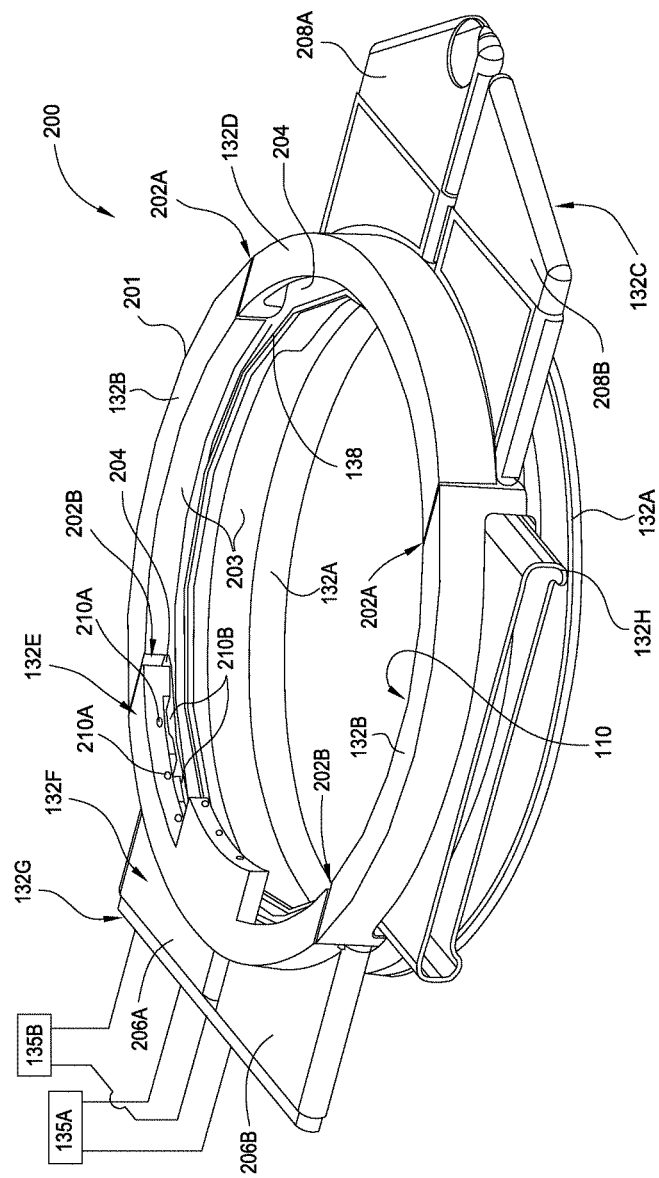
FIG. 2 is an isometric view of one embodiment of a process kit that may be utilized in the chamber of FIG. 1A.

FIG. 2 is an isometric view of one embodiment of a process kit 200 comprising one or more liners 132A-132H as shown in FIGS. 1A and 1B. The liners 132A-132H are modular and are adapted to be replaced singularly or collectively. The liners 132A-132H are low-cost and provide additional flexibility and cost savings due to the modular design. For example, one or more of the liners 132A-132H may be replaced with another liner that is adapted for a different process without the replacement of other liners 132A-132H. Therefore, the liners 132A-132H facilitate configuring the chamber 100 for different processes without replacement of all of the liners 132A-132H. This results in a savings in time and costs which lowers chamber downtime and cost of ownership.

The process kit 200 comprises a lower liner 132A and an upper liner 132B. Both of the lower liner 132A and the upper liner 132B include a generally cylindrical outer diameter 201 that is sized to be received in the chamber 100 of FIGS. 1A and 1B. Each of the liners 132A-132H are configured to be supported within the chamber by gravity and/or interlocking devices, such as protrusions and mating recesses formed in or on some of the liners 132A-132H. Interior surfaces 203 of the lower liner 132A and the upper liner 132B form a portion of the processing volume 110. The upper liner 132B includes cut-out portions 202A and 202B sized to receive the exhaust liner 132D and the injector liner 132E, which are shown in cross-section in FIG. 1A. Each of the cut-out portions 202A, 202B define recessed areas 204 of the upper liner 132B adjacent the inwardly extending shoulder 138.

In this embodiment, each of the inject insert liner assembly 132F and the exhaust insert liner assembly 132C comprise two sections. The inject insert liner assembly 132F includes a first section 206A and a second section 206B that are coupled at one side by the baffle liner 132G. Likewise, the exhaust insert liner assembly 132C includes a first section 208A and a second section 208B. Each of the sections 206A and 206B of the inject insert liner assembly 132F receive gases from the first gas source 135A and the second gas source 135B through the baffle liner 132G. Gases are flowed through the inject insert liner assembly 132F and routed to a plurality of first outlets 210A and a plurality of second outlets 210B in the injector liner 132E. In one aspect, the inject insert liner assembly 132F and the injector liner 132E comprise a gas distribution manifold liner. Thus, the gases from the first gas source 135A and the second gas source 135B are flowed separately into the processing volume 110. Each of the gases may be dissociated before, during or after exiting the outlets 210A, 2108 and flow across the processing volume 110 for deposition on a substrate (not shown). The dissociated precursors remaining after deposition are flowed into the exhaust insert liner assembly 132C and exhausted.

Each of the liners 132A-132H may be fabricated from quartz or other process resistant material. Each of the liners 132A-132H may be transparent or opaque depending on the desired process. For example, transparent quartz may be utilized to allow optical energy from the lamp modules 118A, 118B to pass therethrough to aid in temperature control of the chamber 100 and/or the state of precursor gases. In one example, one or more of the liners 132A-132H may be opaque to absorb optical energy form the lamp modules 118A, 118B. In another example, the injector liner 132E and/or the exhaust insert liner assembly 132C may be transparent quartz to allow optical energy to impinge the precursor gases. The optical energy may be utilized to preheat precursor gases, dissociate precursor gases, and/or maintain dissociation temperatures of precursor gases. In one aspect, the optical energy provided through the transparent quartz material of the injector liner 132E may be utilized to heat precursor gases causing the precursor gases to dissociate within the injector liner 132E prior to exiting the outlets 210A, 210B. The exhaust insert liner assembly 132C may also be fabricated from transparent quartz to allow optical energy to impinge precursor gases as the gases are exhausted. Thus, use of transparent quartz or opaque quartz on any of the liners 132A-132H may be chosen based on thermal considerations. Additionally, any one or a combination of the liners 132A-132H that are transparent may be replaced with an opaque liner, or vice versa, without replacement of other liners 132A-132H. This provides easy adaptability to configure the chamber for different gases and/or processes without replacement of all of the liners 132A-132H.

The liners 132A-132H may be installed and/accessed within the chamber 100 of FIG. 1A by removing the upper quartz window 120 from the metallic walls 134 of the chamber 100 in order to access the upper chamber 106 and the lower chamber 108. In one embodiment, at least a portion of the metallic walls 134 may be removable to facilitate replacement of the liners 132A-132H. The baffle liner 132G is coupled with the inject cap 129, which may be fastened to an exterior of the chamber 100. The lower liner 132A, which includes an inside diameter that is greater than the horizontal dimension of the substrate support 112, is installed in the lower chamber 108. The lower liner 132A may rest on the lower quartz window 122. The exhaust insert liner assembly 132C, the inject insert liner assembly 132F, and the slit valve liner 132H may be installed after the lower liner 132A is positioned on the lower quartz window 122. The inject insert liner assembly 132F may be coupled with the baffle liner 132G to facilitate gas flow from the first gas source 135A and the second gas source 135B. The upper liner 132B may be installed after installation of the exhaust insert liner assembly 132C, the inject insert liner assembly 132F, and the slit valve liner 132H. At this point, the annular pre-heat ring 140 may be positioned on the inwardly extending shoulder 138 of the upper liner 132B. The injector liner 132E may be installed within an aperture formed in the upper liner 132B and coupled with the inject insert liner assembly 132F to facilitate gas flow from the inject insert liner assembly 132F to the injector liner 132E. The exhaust liner 132D may be installed above the exhaust insert liner assembly 132C within an aperture formed in the upper liner 132B opposite the injector liner 132E. The liners 132A-132H may be sequentially installed in the order described above and may be sequentially removed in a reverse order. In some embodiments, the injector liner 132E may be replaced with another injector liner configured for a different gas flow scheme. Thus, replacement of the injector liner 132E only requires removal of the upper quartz window 120 from the metallic walls 134 of the chamber 100. Likewise, the exhaust insert liner assembly 132C may be replaced with another exhaust insert liner assembly configured for a different exhaust flow scheme. Replacement of the exhaust insert liner assembly 132C only requires removal of the upper quartz window 120 and the exhaust insert liner assembly 132C. Additionally, transparent liners of any of the liners 132A-132H may be replaced with opaque liners by removing only the selected liners and any intervening liners.

Figure 3A:
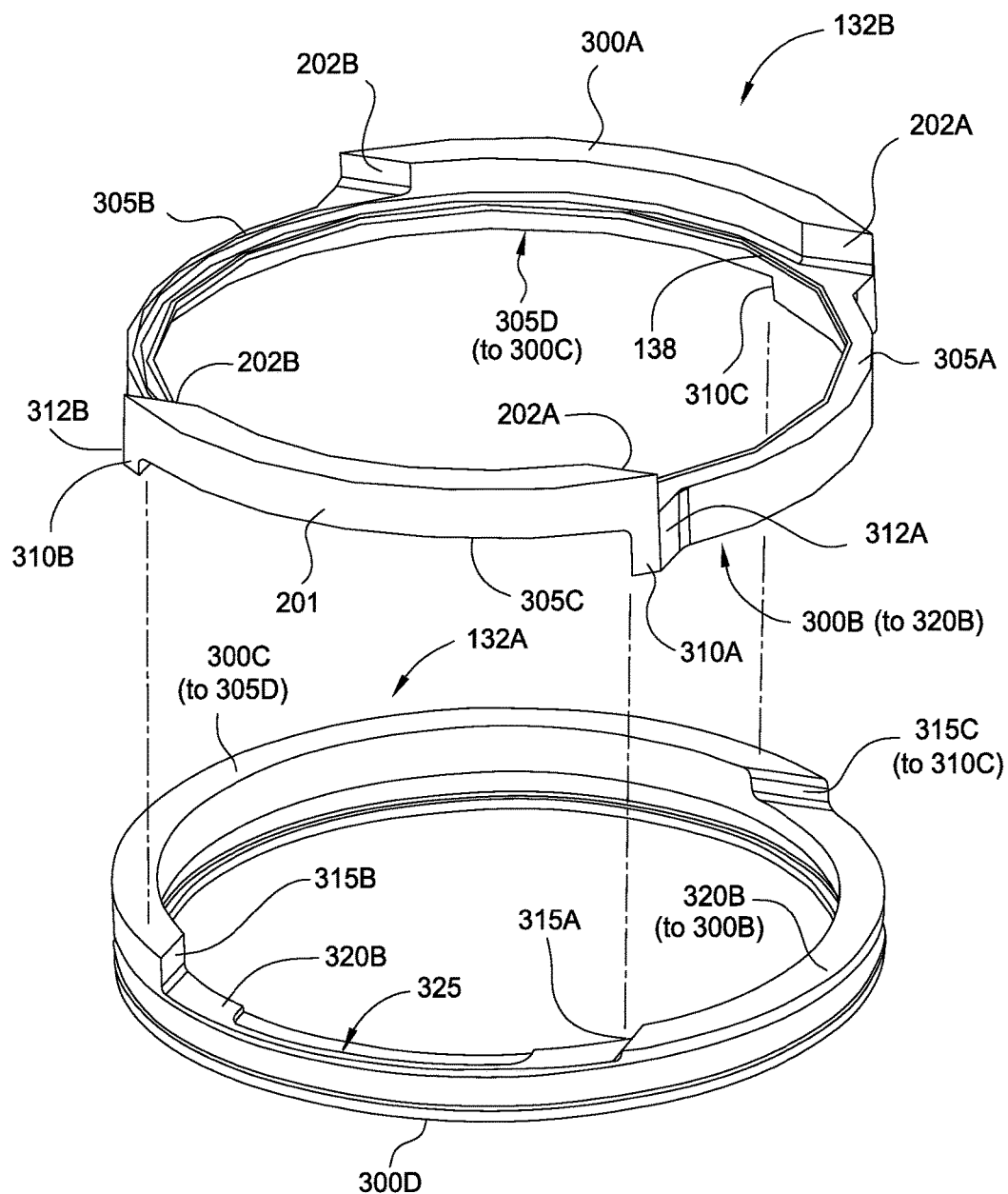
FIG. 3A is an exploded isometric view of the lower liner and the upper liner of FIG. 2.

FIG. 3A is an exploded isometric view of the lower liner 132A and the upper liner 132B of FIG. 2. The upper liner 132B includes an upper surface 300A and a lower surface 300B. At least a portion of the upper surface 300A of the upper liner 132B is adapted to be adjacent or in contact with the upper quartz window 120 (shown in FIG. 1A). The upper surface 300A of the upper liner 132B also includes one or more recessed portions 305A, 305B formed between cut-out portions 202A and 202B. In one embodiment, the recessed portion 305A is opposing or substantially 180 degrees from the recessed portion 305B. The recessed portion 305A receives a portion of the exhaust insert liner assembly 132C (shown in FIG. 2) while the recessed portion 305B receives a portion of the inject insert liner assembly 132F and/or the injector liner 132E (shown in FIG. 2). The lower surface 300B of the upper liner 132B also includes walls 310A-310C. At least the walls 310B and 310C extend out of the plane of a recessed portion 305D formed in the lower surface 300B. An outer surface 312A, 312B of the walls 310A, 310B are configured to be received between and/or contact cut-out portions 315A and 315B of the lower liner 132A. The upper liner 132B includes a recessed portion 305C formed in the lower surface 300B between walls 310A and 310B. The recessed portion 305C receives a portion of the slit valve liner 132H (shown in FIG. 2) between an interior surface of the walls 310A, 310B. In one embodiment, the recessed portion 305C is substantially normal to the recessed portion 305A and/or the recessed portion 305B.

The lower liner 132A includes an upper surface 300C and a lower surface 300D. At least a portion of the lower surface 300D of the lower liner 132A is adapted to be adjacent or in contact with the lower quartz window 122 (shown in FIG. 1A). At least one recessed portion is formed in the upper surface 300C. A first recessed portion 320A is formed between the cut-out portions 315A and 315B and a second recessed portion 320B is formed between the cut-out portions 315B and 315C. The recessed portion 320A is disposed below the planes of the recessed portion 320B and the upper surface 300C of the lower liner 132A. The recessed portion 320A includes a channel 325 configured as a portion of an interlock device. The channel 325 is adapted to receive a raised feature formed on the slit valve liner 132H (not shown) to function as the interlock device between the lower liner 132A and the slit valve liner 132H. In one embodiment (not shown), the recess 305C of the upper liner 132B includes a channel that is similar in construction and function to the channel 325. Thus, the slit valve liner 132H may be fixedly coupled to the lower liner 132A and the upper liner 132B when the process kit 200 is installed and/or in use.

In one embodiment, the lower liner 132A may comprise a first liner and the upper liner 132B may comprise a second liner, and one or a combination of the exhaust insert liner assembly 132C, the slit valve liner 132H, the inject insert liner assembly 132F and the injector liner 132E (all shown in FIG. 2) may be comprise a third liner.

Figure 3B:
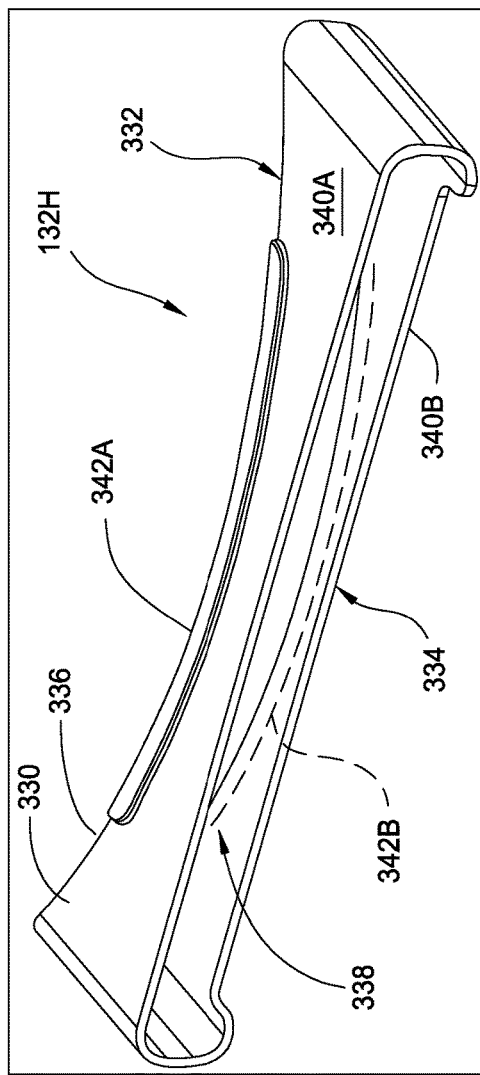
FIG. 3B is an isometric view of the slit valve liner of FIG. 2.

FIG. 3B is an isometric view of the slit valve liner 132H of FIG. 2. The slit valve liner 132H includes a body 330 having a first end 332 and a second end 334. The first end 332 includes a surface 336 having a radius. In one embodiment, the surface 336 has a radius that substantially matches the inside diameter of the interior surface 203 (FIG. 2) of the lower liner 132A and the upper liner 132B. In one aspect, the surface 336 is in communication with the processing volume 110 (FIGS. 1A and 1B) while the second end 334 is disposed outside of the processing volume 110. The body 330 also includes a sidewall 340A and a sidewall 340B that are spaced apart to form a substrate transfer slot 338. Although the substrate transfer slot 338 may be configured for other substrate sizes, the substrate transfer slot 338 is utilized to transfer 200 mm or 300 mm substrates utilizing a robot blade (not shown).

In this embodiment, both of the sidewalls 340A, 340B include a raised feature 342A, 342B that forms part of the interlock device described in FIG. 3A. For example, the raised feature 342B (shown in phantom) disposed on the sidewall 340B may be one or more tabs or protrusions utilized to interface with the channel 325 formed in the lower liner 132A of FIG. 2. The sidewall 340A may include a raised feature 342B that couples with a channel disposed on the upper liner 132B of FIG. 2. In one embodiment, each of the raised features 342A, 342B are disposed on a radius that is substantially similar to the radius of the surface 336.

Figure 3C:
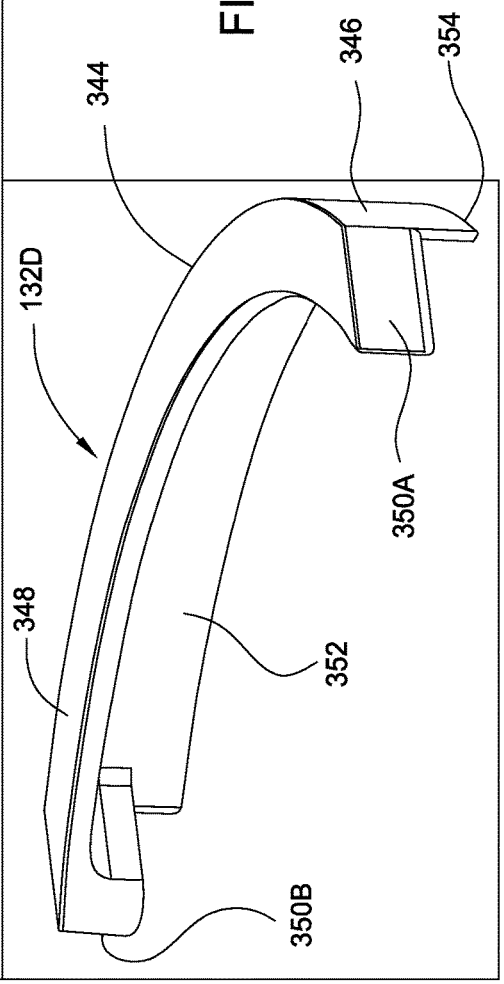
FIG. 3C is an isometric view of the exhaust liner of FIG. 2.

FIG. 3C is an isometric view of the exhaust liner 132D of FIG. 2. The exhaust liner 132D is configured to fill the space between an upper surface of the exhaust insert liner assembly 132C and the upper quartz window 120 (shown in FIG. 1A). The exhaust liner 132D includes a body 344. The body 344 includes an outer surface 346, an inwardly extending wall 348, sidewalls 350A, 350B and an inner surface 352. A bottom edge 354 of the outer surface 346 is configured to contact at least a portion of the exhaust insert liner assembly 132C. The inwardly extending wall 348 is adapted to be adjacent or in contact with the upper quartz window 120 (shown in FIG. 1A). The sidewalls 350A and 350B are adapted to be adjacent or in contact with the cut-out portions 202A of the upper liner 132B (FIG. 2). The exhaust liner 132D is configured to at least partially support to the exhaust insert liner assembly 132C when the process kit 200 is installed or in use.

Figure 3D:
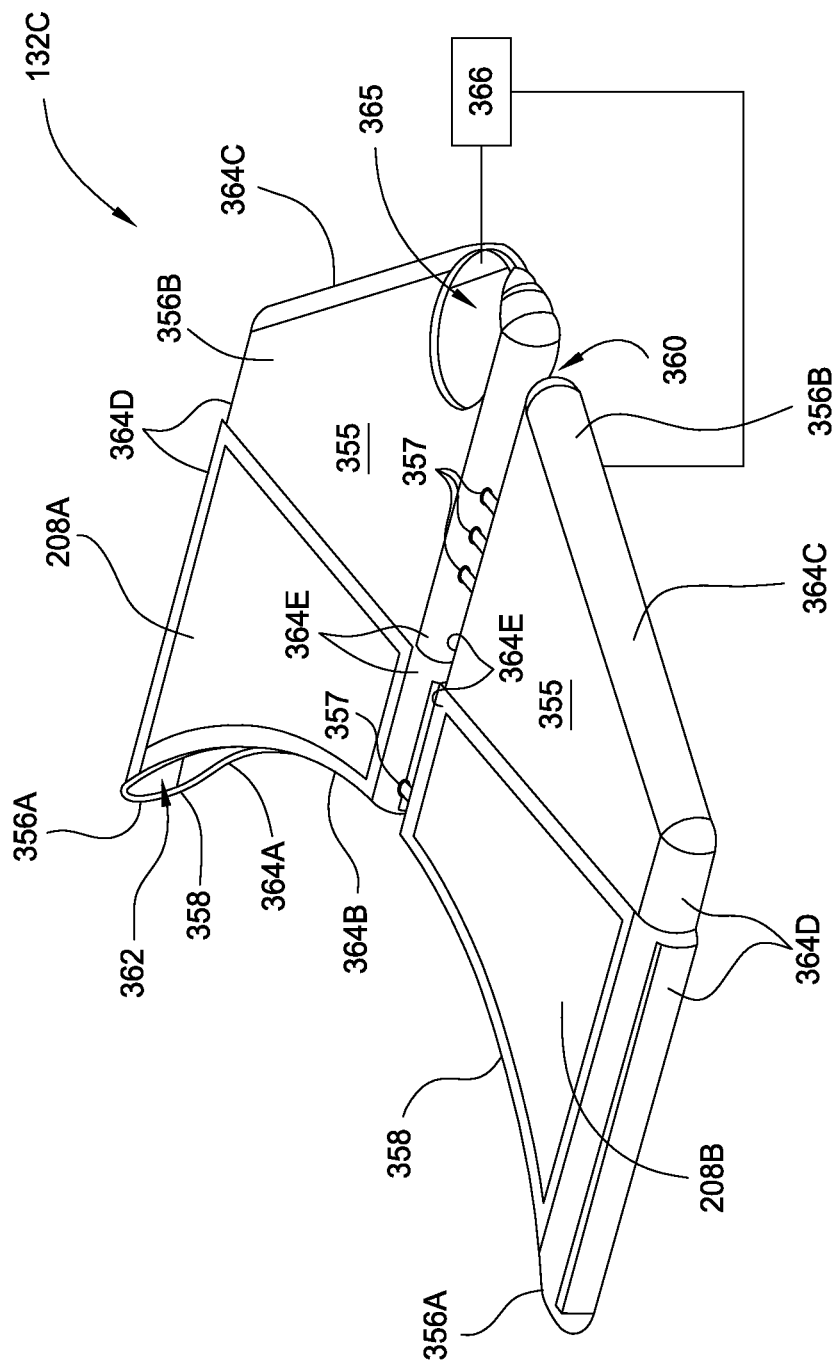
FIG. 3D is an isometric view of the exhaust insert liner assembly of FIG. 2.

FIG. 3D is an isometric view of the exhaust insert liner assembly 132C of FIG. 2. The exhaust insert liner assembly 132C includes a first section 208A and a second section 208B. Each of the sections 208A, 208B include a body 355. Each body 355 includes a first end 356A and a second end 356B. The first end 356A includes a surface 358 formed on a radius. In one embodiment, the surface 358 has a radius that substantially matches the inside diameter of the interior surface 203 (FIG. 2) of the lower liner 132A and the upper liner 132B. In one aspect, the surface 358 is in communication with the processing volume 110 (FIGS. 1A and 1B) while the second end 356B is disposed outside of the processing volume 110. In one embodiment, the first section 208A and the second section 208B are substantially similar in shape and size. In one aspect, the first section 208A is a mirror-image of the second section 208B. A plenum 362 is formed by walls 364A-364E of the body 355. The plenum 362 is adapted to receive exhaust gases at the first end 356A and flow the exhaust gases to the second end 356B. A port 365 is formed in the second end 356B. The port 365 is adapted to couple to an exhaust device, such as a vacuum pump 366. In some embodiments, a gap 360 is formed between the first section 208A and the second section 208B. In other embodiments, the first section 208A and the second section 208B are in fluid communication, such as by one or more channels 357 that facilitate flow of exhaust gases between the first section 208A and the second section 208B.

Figure 4:
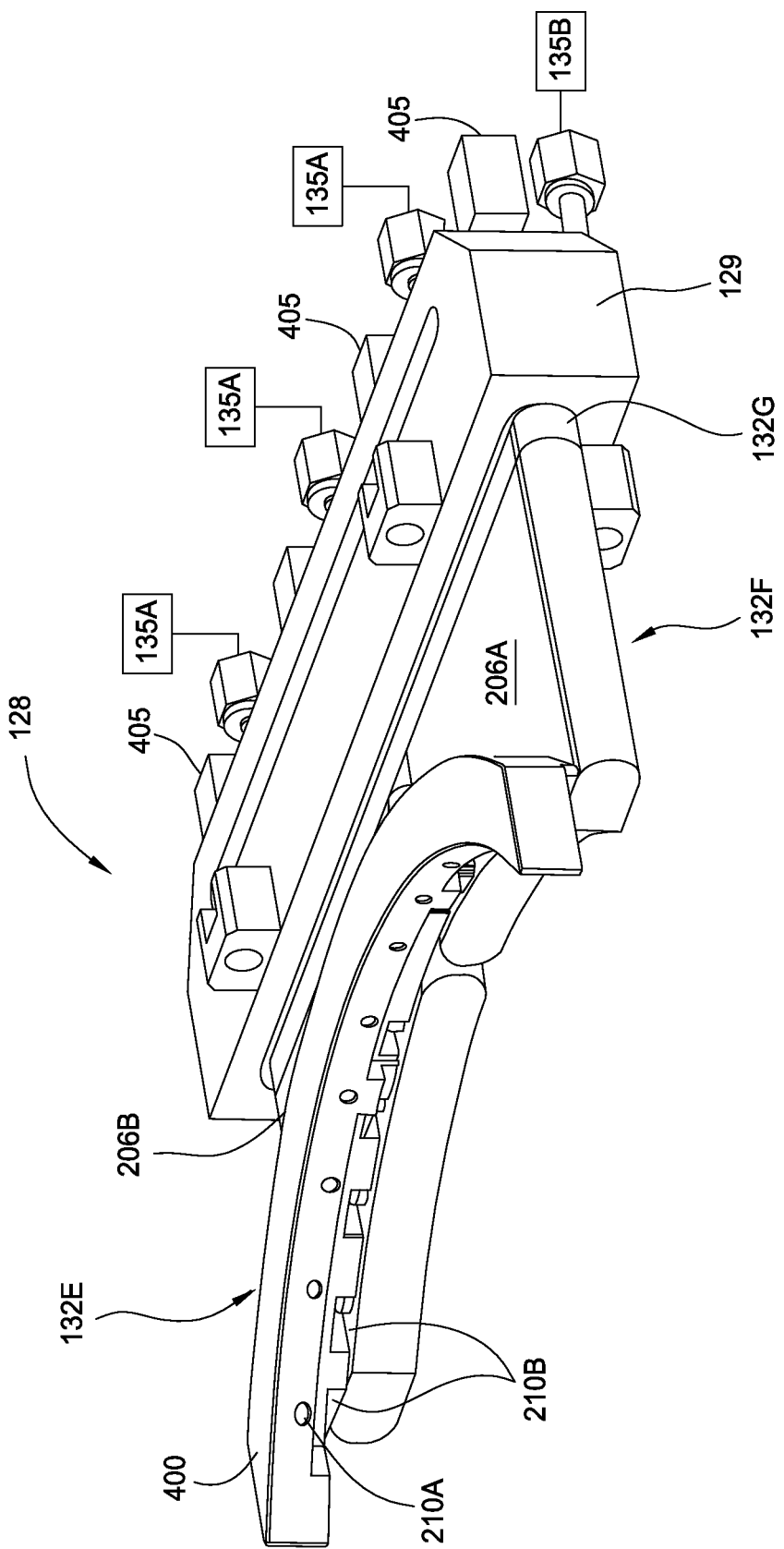
FIG. 4 is an isometric view of the gas distribution assembly shown in FIG. 1A.

FIG. 4 is an isometric view of the gas distribution assembly 128 shown in FIG. 1A having embodiments of the injector liner 132E, the baffle liner 132G, and the inject insert liner assembly 132F of FIG. 2. In this embodiment of the injector liner 132E, a gas distribution manifold liner 400 configured to distribute gases is shown coupled to the inject insert liner assembly 132F. The gas distribution manifold liner 400 is configured to be interchangeable with other gas distribution manifold liners. The gas distribution manifold liner 400 is easily coupled and decoupled from the inject insert liner assembly 132F to facilitate ease of replacement.

Process gases from the first gas source 135A and the second gas source 135B are flowed through the inject cap 129. The inject cap 129 includes multiple gas passageways that are coupled to ports (not shown) formed in the baffle liner 132G. In one embodiment, lamp modules 405 may be disposed in the inject cap 129 to preheat precursor gases within the inject cap 129. An example of an inject cap having multiple gas passageways is described in United States patent publication No. 2008/0210163, published Sep. 4, 2008, which is incorporated herein by reference in its entirety.

The baffle liner 132G includes conduits (not shown) that flow the gases into the inject insert liner assembly 132F. The inject insert liner assembly 132F includes ports (not shown) that route gases to the first outlets 210A and the second outlets 210B of the gas distribution manifold liner 400. In one embodiment, the gases from the first gas source 135A and the second gas source 135B remain separated until the gases exit the first outlets 210A and the second outlets 210B. In one aspect, the gases are preheated within the inject cap 129 and one or more of the baffle liner 132G, the inject insert liner assembly 132F, and the gas distribution manifold liner 400. The preheating of the gases may be provided by one or combination of the lamp modules 405 on the inject cap 129, the upper lamp modules 118A, and the lower lamp modules 118B (both shown in FIG. 1A). One or a combination of the baffle liner 132G, the inject insert liner assembly 132F and the gas distribution manifold liner 400 may comprise transparent quartz or opaque quartz to facilitate heating from the lamp modules 405 on the inject cap 129, the upper lamp modules 118A, or the lower lamp modules 118B. In one aspect, the gases are heated by energy from the lamp modules 405 on the inject cap 129, the upper lamp modules 118A, and/or the lower lamp modules 118B such that the gases are dissociated or ionized prior to or exiting the first outlets 210A and the second outlets 210B. Depending on the dissociation temperature of process gases utilized in the first gas source 135A and the second gas source 135B, only one of the gases may be ionized when exiting the gas distribution manifold liner 400 while the other gas heated but remains in gaseous form when exiting the gas distribution manifold liner 400.

FIG. 5A is an isometric cross-sectional view of the inject cap 129, the baffle liner 132G, the inject insert liner assembly 132F, and the gas distribution manifold liner 400 of FIG. 4. In one aspect, each of the baffle liner 132G, the inject insert liner assembly 132F, and the gas distribution manifold liner 400 are configured as a manifold for distribution of gases from the first gas source 135A and the second gas source 135B. In one embodiment, the inject cap 129 is a first manifold having a first gas passage 500A coupled to the first gas source 135A and a second gas passage 500B coupled to the second gas source 135B. The inject cap 129 also includes multiple chambers, such as a first chamber 505A and a second chamber 505B. The first chamber 505A and the second chamber 505B are in fluid communication with the first gas passage 500A and the second gas passage 500B, respectively.

A first gas from the first gas source 135A is flowed from the first chamber 505A through a first conduit 510A within the inject cap 129. The first conduit 510A is in fluid communication with a first orifice 515A disposed in the baffle liner 132G. The first gas then flows through the first orifice 515A into the inject insert liner assembly 132F, which is configured as a second manifold. The inject insert liner assembly 132F includes a first gas passage 520A. The inject insert liner assembly 132F includes a channel 525A having a longitudinal axis that is substantially orthogonal to the longitudinal axis of the first gas passage 520A. The first gas flows from the channel 525A into the gas distribution manifold liner 400, which is configured as a third manifold. The gas distribution manifold liner 400 includes a first plenum 530A that is in fluid communication with a nozzle 535. In one embodiment, the nozzle 535 is sized smaller than the first plenum 530A in order to restrict gas flow through the gas distribution manifold liner 400. Therefore, the first gas exits the first outlet 210A at a high velocity.

FIG. 5B is an isometric cross-sectional view of the inject cap 129, the baffle liner 132G, the inject insert liner assembly 132F, and the gas distribution manifold liner 400 of FIG. 5A. A second gas from the second gas source 135B is flowed from the second chamber 505B through a second conduit 510B within the inject cap 129. The second conduit 510B is in fluid communication with a second orifice 515B disposed in the baffle liner 132G. The second gas then flows through the second orifice 515B into the inject insert liner assembly 132F. The inject insert liner assembly 132F includes a second gas passage 520B. The inject insert liner assembly 132F includes a channel 525B having a longitudinal axis that is substantially orthogonal to the longitudinal axis of the second gas passage 520B. The second gas flows from the channel 525B into the gas distribution manifold liner 400. The gas distribution manifold liner 400 includes a second plenum 530B which opens into the second outlet 210B. The second plenum 530B is sized to prevent restriction and provide a laminar flow of the second gas as the gas exits the second outlet 210B. Thus, the second gas exits the second outlet 210B at a velocity that is much lower than the velocity of the first gas exiting the first outlet 210A to provide the laminar flow.

Figure 5C:
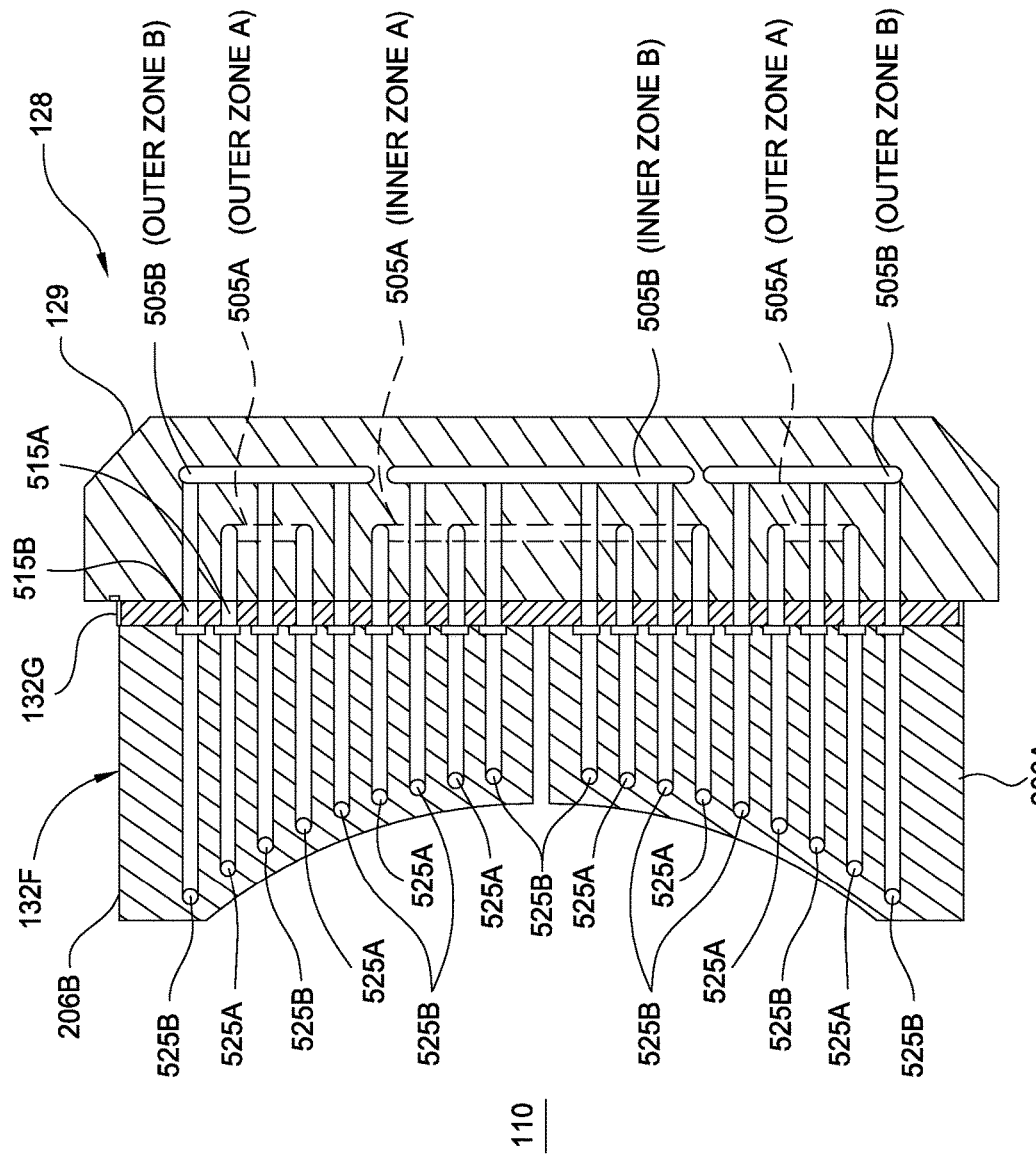
FIG. 5C is a schematic top cross-sectional view of the gas distribution assembly of FIG. 4.

FIG. 5C is a schematic top cross-sectional view of the gas distribution assembly 128 of FIG. 4. In one embodiment, the gas distribution assembly 128 is configured to flow gases in multiple zones into the processing volume 110. The inject cap 129 includes a plurality of first chambers 505A (shown in phantom) and a plurality of second chambers 505B. In this embodiment, two first chambers 505A are disposed laterally outward of the first chamber 505A in the central region of the inject cap 129. The first chamber 505A in the central region of the inject cap 129 defines an inner zone A while the two first chambers 505A define an outer zone A. Each of the first chambers 505A are in fluid communication with a plurality of first channels 525A disposed in the inject insert liner assembly 132F. Flow rates of the first gas may be controlled within each of the first chambers 505A and flowed to the plurality of first channels 525A. The gases are flowed from the first chambers 505A to the channels 525A and then dispersed through the openings 210A in the gas distribution manifold liner 400 (not shown in this view).

Likewise, the inject cap 129 includes two second chambers 505B that are disposed laterally outward of the second chamber 505B disposed in the central region of the inject cap 129. The second chamber 505B in the central region of the inject cap 129 defines an inner zone B while the two second chambers 505B define an outer zone B. Each of the second chambers 505B are in fluid communication with a plurality of channels 525B disposed in the inject insert liner assembly 132F. Flow rates of the second gas may be controlled within each of the second chambers 505B and flowed to the plurality of channels 525B. In one aspect, each of the inner zone A and inner zone B are spaced-apart horizontally or laterally to define the injection zones. In one embodiment, each of the channels 525A alternate with the channels 525B within each section 206A, 206B, as shown. The construction of the gas distribution assembly 128 may be changed such that the channels 525A and 525B may be adjacent each other or grouped in a different configuration.

FIG. 6A is an isometric view of a section 206A of the inject insert liner assembly 132F shown in FIG. 4. The section 206B of the inject insert liner assembly 132F is substantially similar to the section 206A and will not be described for brevity. The section 206A includes a body 600 having an upper surface 605, a minor side 610A and a major side 610B. The body 600 also includes a first surface 615A and a second surface 615B between the minor side 610A and the major side 610B. When installed, the first surface 615A is outside of the housing structure 102 of the chamber 100 (FIG. 1A) while the second surface 615B is within the housing structure 102 of the chamber 100. Thus, a the second surface 615B of the section 206A is in contact with the processing volume 110 during processing while the first surface 615A and a portion of the body 600 adjacent the first surface 615A is in ambient conditions.

Each of the minor side 610A and the major side 610B include a length. The length of the major side 610B is greater than the length of the minor side 610A. The first surface 615A is planar while the second surface 615B is described by an arc, which gives the body 600 of the section 206A a "pan flute" shape. The body 600 also includes a plurality of interlock devices 620 either formed in the body 600, disposed on the body 600, or protruding from the body 600. In one embodiment, at least a portion of the interlock devices 620 comprise protrusions 625A extending from the body 600 that are adapted as a male interface. At least a portion of the interlock devices 620 comprise depressions 625B formed in the body and are adapted as a female interface. The interlock devices 620 may be utilized as an indexing feature as well as a mating interface allowing elements of the process kit 200 to be coupled and decoupled. The interlock devices 620 also contain channels 525A and 525B, and the first gas passages 520A and the second gas passages 520B. The interlock devices 620 may be utilized as seals to prevent leakage from or between the channels 525A, 525B and passages 520A, 520B. The interlock devices 620 may be circular, such as the protrusions 625A, polygonal, such as the depressions 625B, or combinations thereof. The interlock devices 620 disposed on the first surface 615A are adapted to couple with mating interlock devices 620 disposed on the baffle liner 132G. The interlock devices 620 disposed on the upper surface 605 are adapted to couple with and facilitate attachment with corresponding interlock devices 620 disposed on a gas distribution manifold liner 400 (not shown).

FIG. 6B is an isometric view of the baffle liner 132G of FIG. 4. The baffle liner 132G includes a body 630. The body 630 includes a first side 635A and a second side 635B. At least the first side 635A includes a plurality of interlock devices 620. The second side 635B may also include a plurality of interlock devices 620 to facilitate coupling of the baffle liner 132G to the inject cap 129 (not shown). The interlock devices 620 are similar to the interlock devices 620 described in FIG. 6A and may include protrusions 625A as shown, depressions 625B (not shown), or combinations thereof. The interlock devices 620 may contain the first orifices 515A and the second orifices 515B as shown. A portion of the first side 635A is adapted to couple to the first surface 615A of the section 206A. Attachment of the section 206A to the baffle liner 132G is facilitated by the interlock devices 620. The remaining portion of the first side 635A is adapted to couple to the section 206B (not shown). To facilitate coupling to the sections 206A and 206B, the body 630 includes a length that is at least two times greater than a length of the first surface 615A of the section 206A (FIG. 6A) and section 206B (FIG. 4).

Figure 7:
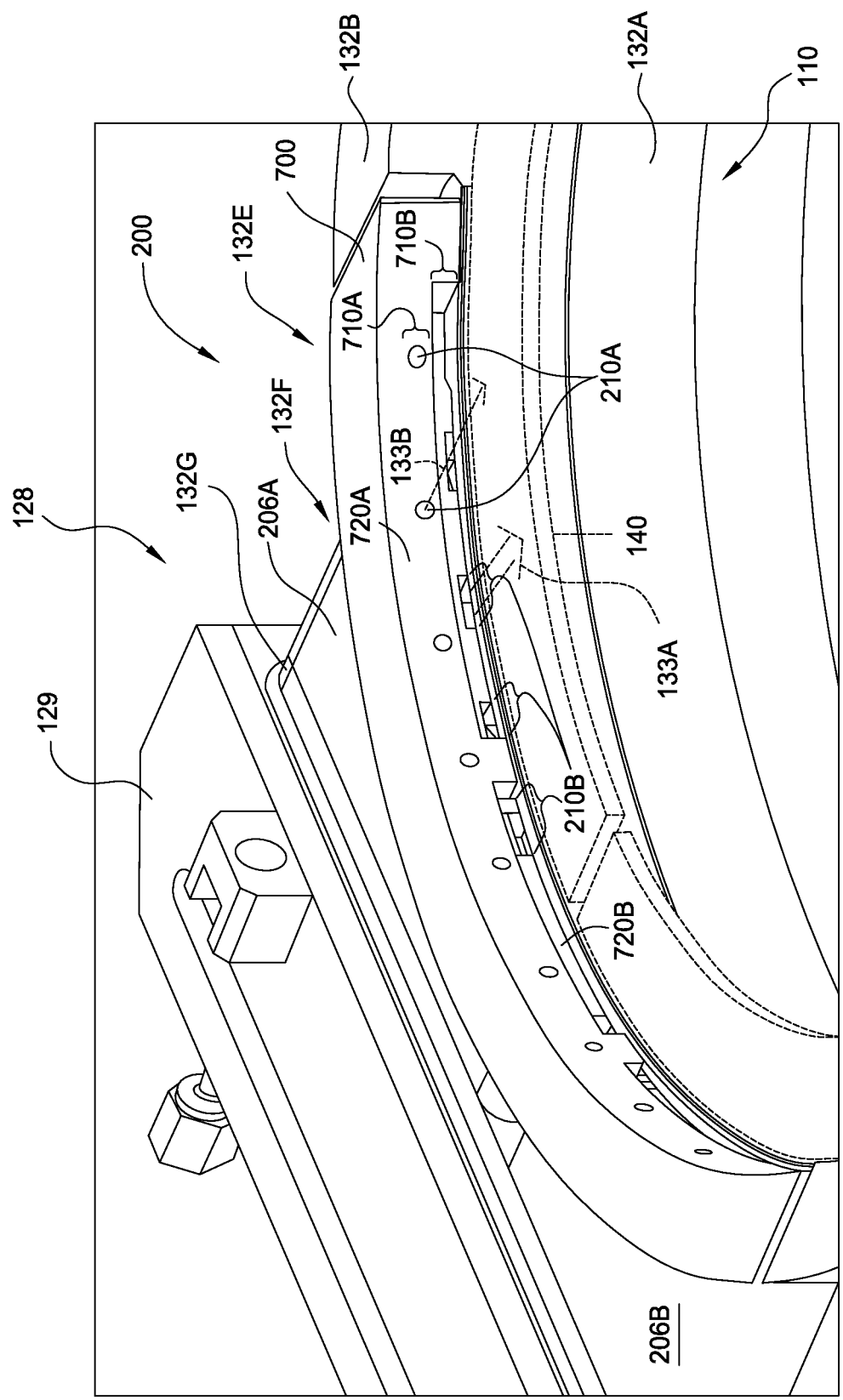
FIG. 7 is a partial isometric view of another embodiment of a process kit that may be utilized in the chamber of FIG. 1A.

FIG. 7 is a partial isometric view of one embodiment of a process kit 200 that may be utilized in the chamber 100 of FIG. 1A. The process kit 200 includes one embodiment of an injector liner 132E, shown as a gas distribution manifold liner 700, that may be coupled to the inject insert liner assembly 132F. A baffle liner 132G is shown between the inject cap 129 and the sections 206A and 206B of the inject insert liner assembly 132F.

The gas distribution manifold liner 700 includes a dual zone inject capability wherein each zone provides different flow properties, such as a velocity. The dual zone injection comprises a first injection zone 710A and a second injection zone 710B disposed in different planes that are spaced vertically. In one embodiment, each of the injection zones 710A and 710B are be spaced-apart to form an upper zone and a lower zone. The first injection zone 710A includes a plurality of first outlets 210A and the second injection zone 7108 includes a plurality of second outlets 210B. In one embodiment, each of the first outlets 210A are disposed in a first surface 720A of the gas distribution manifold liner 700 while each of the second outlets 210B are disposed in a second surface 720B of the gas distribution manifold liner 700 that is recessed from the first surface 720A. For example, the first surface 720A may be formed on a radius that is less than the radius utilized to form the second surface 720B.

In one embodiment, the injection zones 710A and 710B are adapted to provide different fluid flow paths where flow metrics, such as fluid velocity, may be different. For example, the first outlets 210A of the first injection zone 710A provide fluids at a higher velocity to form a jetted flow path 133B while the second outlets 210B of the second injection zone 710B provide a laminar flow path 133A. The laminar flow paths 133A and jetted flow paths 133B may be provided by one or a combination of gas pressure, size of the outlets 210A, 210B, sizes (e.g., cross-sectional dimensions and/or lengths) of conduits disposed between the outlets 210A, 210B and the chambers 505A, 505B (shown in FIGS. 5A and 5B), and the angle and/or number of bends in the conduits disposed between the outlets 210A, 210B and the chambers 505A, 505B. Velocity of fluids may also be provided by adiabatic expansion of the precursor gases as the fluids enter the processing volume 110.

In one aspect, the dual zone injection provided by the first injection zone 710A and the second injection zone 710B facilitates a varied level of injection for different gases. In one embodiment, the first injection zone 710A and the second injection zone 710B is spaced-apart in different planes to provide a precursor to the processing volume 110 (shown in FIG. 1A) at different vertical distances above the surface 116 of the substrate 114 (both shown in FIG. 1A). This vertical spacing may provide enhanced deposition parameters by accounting for adiabatic expansion of certain gases that may be utilized.

Figure 8:
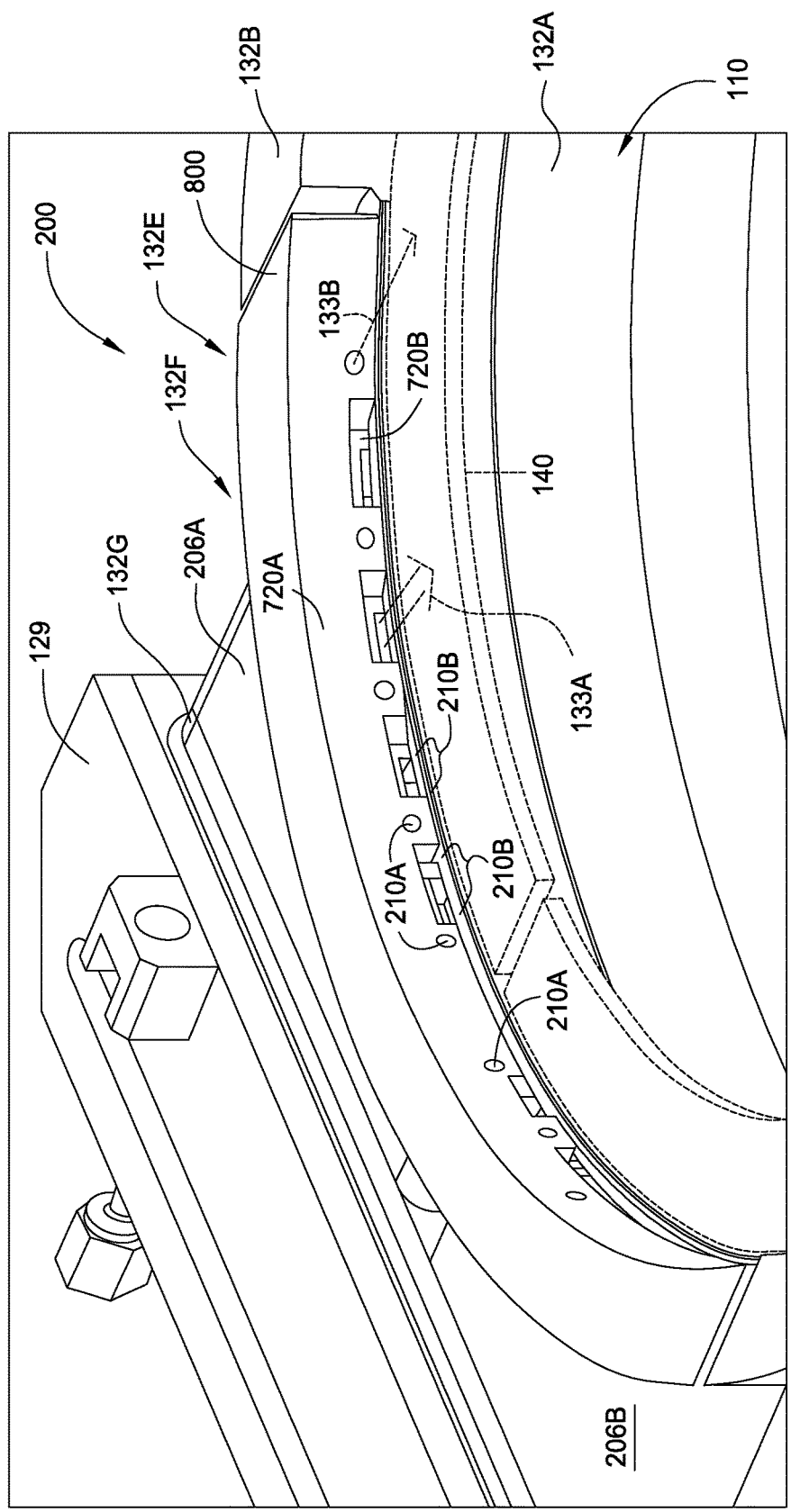
FIG. 8 is a partial isometric view of another embodiment of a process kit that may be utilized in the chamber of FIG. 1A.

FIG. 8 is a partial isometric view of another embodiment of a process kit 200 that may be utilized in the chamber 100 of FIG. 1A. The process kit 200 is similar to the process kit 200 shown in FIG. 7 with the exception of a different embodiment of an injector liner 132E, shown as a gas distribution manifold liner 800. In this embodiment, the first outlets 210A and the second outlets are disposed in substantially in the same plane.

Figure 9:
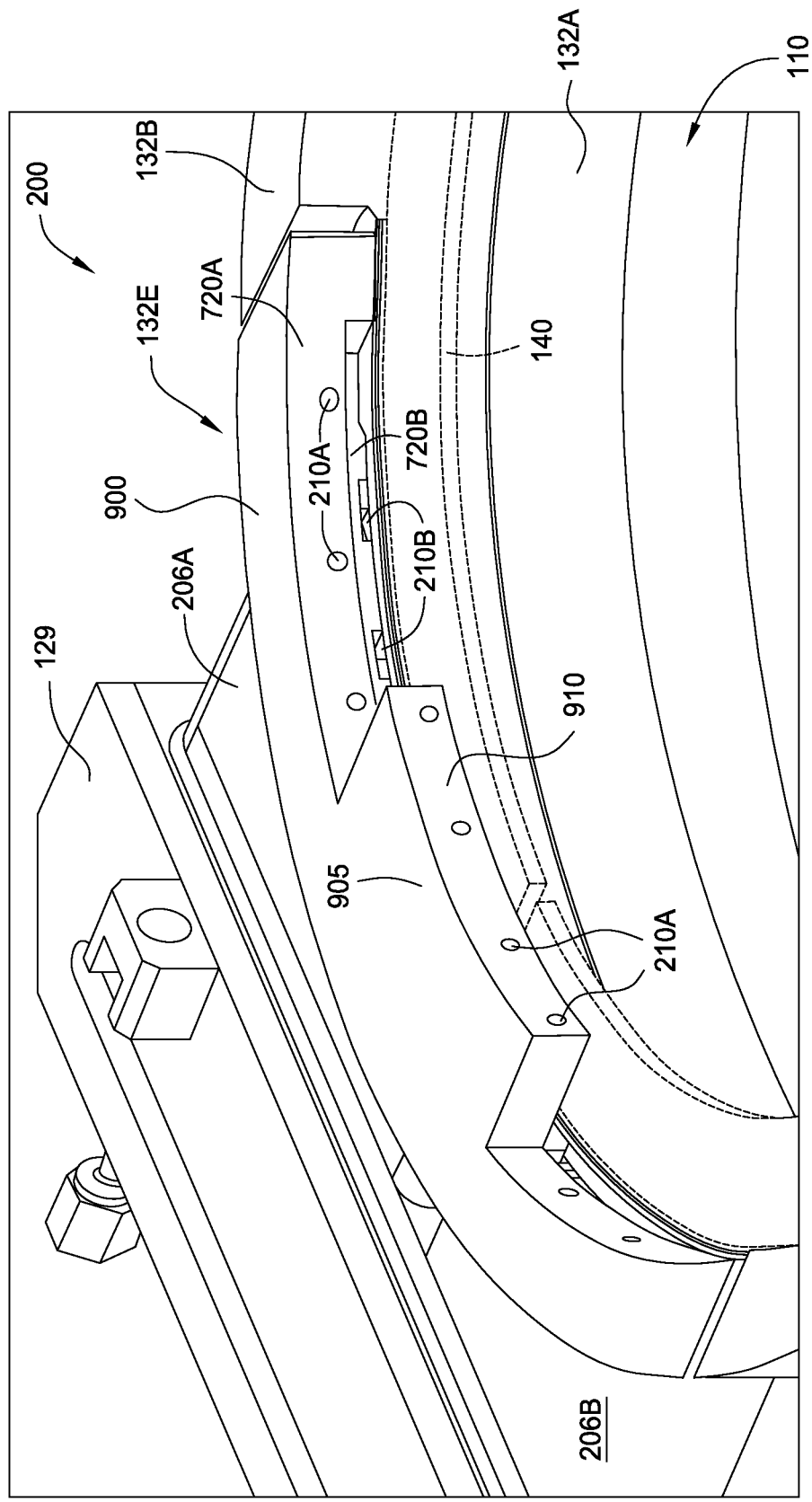
FIG. 9 is a partial isometric view of another embodiment of a process kit that may be utilized in the chamber of FIG. 1A.

FIG. 9 is a partial isometric view of another embodiment of a process kit 200 that may be utilized in the chamber 100 of FIG. 1A. The process kit 200 is similar to the process kit 200 shown in FIG. 7 or 8 with the exception of a different embodiment of an injector liner 132E, shown as a gas distribution manifold liner 900. In this embodiment, the gas distribution manifold liner 900 includes an extended member 905 extending inwardly from the first surface 720A. The extended member 905 includes a third surface 910 that extends further into the processing volume 110 than each of the first surface 720A and second surface 720B of the gas distribution manifold liner 900. The extended member 905 includes a portion of the first outlets 210A while the remainder of the first outlets 210A are disposed in the first surface 720A of the gas distribution manifold liner 900.

One or a combination of the flow paths provided by the first outlets 210A and the second outlets 210B enables deposition uniformity and uniform growth across the substrate (not shown). In one embodiment, the first outlets 210A of the extended member 905 are utilized to inject precursor gases that tend to dissociate faster than precursors provided by the second outlets 210B. This provides an extended flow path to inject the faster dissociating precursor a further distance and/or closer to the center of the substrate 114. Thus, the combination of precursors from both of the first outlets 210A and the second outlets 210B provides uniform distribution and growth across the substrate 114.

In an example of operation, precursors to form Si and SiGe, or Ga or As blanket or selective films are provided to the injector liner 132E from the one or more gas sources 135A and 135B (shown in FIG. 1A). The gas sources 135A, 135B may include silicon precursors such as silanes, including silane ($SiH_4$), disilane ($Si_2H_6$,), dichlorosilane ($SiH_2Cl_2$), hexachlorodisilane ($Si_2Cl_6$), dibromosilane ($SiH_2Br_2$), higher order silanes, derivatives thereof, and combinations thereof, which may include germanium containing precursors, such as $GeH_4$, $Ge_2H_6$, $GeCl_4$, $GeH_2Cl_2$, derivatives thereof, and combinations thereof. The gas sources 135A, 135B may also include gallium containing precursors, such as trimethylgallium ($Ga(CH_3)_3$ (TMGa)), gallium phosphide (GaP), as well as arsenic containing precursors, such as arsenic trichloride ($AsCl_3$), arsine ($AsH_3$), tertiary-butyl arsine (TBA), derivatives thereof, and combinations thereof. The silicon, germanium, gallium and/or arsenic containing precursors may be used in combination with HCl, $Cl_2$, HBr, and combinations thereof. The gas sources 135A, 135B may include one or more of the silicon, germanium, gallium and/or arsenic containing precursors in one or both of the gas sources 135A, 135B. For example, the gas source 135A may include precursor materials, such as $H_2$ or $Cl_2$, while gas source 135B may include silicon, germanium, gallium and/or arsenic containing precursors, derivatives thereof, or combinations thereof. In another aspect, the gas sources 135A, 135B may include one or a combination of Group III and Group V gases. In another aspect, the gas sources 135A, 135B may include tertiary-butyl arsine (TBA) and/or trimethylgallium (TMGa).

The gas sources 135A, 135B may be coupled the injector liner 132E in a manner configured to facilitate discrete introduction zones within a gas distribution assembly 128 (shown in FIGS. 1A and 5A-5C) that is coupled to the injector liner 132E. For example, the gas distribution assembly 128 may facilitate multiple injection zones, such as outer zones A and B and inner zones A and B shown in FIG. 5C. The gases are flowed to the processing volume 110 through the injector liner 132E and injected into the processing volume through first outlets 210A and second outlets 210B in one or more planes that are substantially parallel to the plane of the substrate 114. Further, the gases may be flowed into the processing volume 110 at different velocities. The component gases which are used to clean/passivate a substrate surface or to form the silicon-containing film or gallium-containing film that is being epitaxially grown on the substrate 114 enter the processing volume 110 via the injector liner 132E and exit through the exhaust insert liner 132C.

In one embodiment, the low wavelength radiation in the processing volume 110, provided by the lamp modules 118A and 118B, is used to energize reactive species and assist in adsorption of reactants and desorption of process byproducts from the surface 116 of substrate 114. The low wavelength radiation typically ranges from about 0.8 microns (μm) to about 1.2 μm, for example, between about 0.95 μm to about 1.05 μm. with combinations of various wavelengths being provided, depending on the composition of the film which is being epitaxially grown. Ultraviolet light sources, (not shown) may replace the lamp modules 118A and 118B, or ultraviolet light sources may be used in combination with the lamp modules 118A and 118B. In one embodiment (not shown), radiation is provided by an ultraviolet light source, such as excimer lamps.

The temperature in the processing volume 110 may be controlled within a temperature range of about 200° C. to about 600° C. The pressure in the processing volume 110 may be between about 0.1 Torr to about 600 Torr, such as between about 5 Torr to about 30 Torr. The temperature on the substrate 114 surface 116 may be controlled by power adjustment to the lower lamp modules 118B in lower chamber 108, or by power adjustment to both the upper lamp modules 118A overlying upper chamber 106, and the lower lamp modules 118B underlying lower chamber 108. The power density in the processing volume 110 may be between about 40 $W/cm^2$ to about 400 $W/cm^2$, such as about 80 $W/cm^2$ to about 120 $W/cm^2$.

A liner assembly is provided, which includes a process kit 200, comprising liners 132A-132H as described in FIGS. 1A-9. The liners 132A-132H are modular and are adapted to be replaced singularly or collectively. The liners 132A-132H may be fabricated from quartz, either transparent or opaque quartz, which may be utilized to configure the chamber for different processes. One or more of the liners 132A-132H may be replaced with another liner that is adapted for a different process without the replacement of other liners 132A-132H. Therefore, the liners 132A-132H facilitate configuring the chamber 100 for different processes without replacement of all of the liners 132A-132H. The liners 132A-132H are cost efficient to produce and provide additional flexibility and cost savings due to the modular design.

Further, if one of the liners 132A-132H is damaged, a single replacement liner may be provided without replacement of all of the liners 132A-132H. The liners 132A-132H may be easily replaced if needed. Additionally various embodiments of the gas distribution manifold liner 400, 700, 800 or 900 may be utilized to facilitate different flow patterns of fluids entering the processing volume 110. All of these factors result in a savings in time and costs, which lowers chamber downtime and cost of ownership, as well as enabling flexibility in processes performed in the chamber 100.

While the foregoing is directed to embodiments of the present invention, other and further embodiments of the invention may be devised without departing from the basic scope thereof, and the scope thereof is determined by the claims that follow.

The invention claimed is:

1. A modular liner assembly for a substrate processing chamber, comprising:
   a first liner comprising an annular body sized to be received in a processing volume of a chamber and having a plurality of recessed portions formed therein;
   a second liner comprising an annular body sized to be received in the processing volume of the chamber; and
   a third liner comprising a body that extends through the first liner and the second liner, the third liner having a first end disposed in the process volume and a second end disposed outside of the chamber, wherein one of the plurality of recessed portions receives a portion of the third liner.

2. The liner assembly of claim 1, wherein the third liner comprises a gas distribution manifold.

3. The liner assembly of claim 2, wherein the gas distribution manifold comprises a plurality of first channels and a plurality of second channels.

4. The liner assembly of claim 3, wherein the plurality of first channels alternate with the plurality of second channels.

5. The liner assembly of claim 3, wherein the plurality of first channels provide a flow metric that is different than a flow metric provided by the plurality of second channels.

6. The liner assembly of claim 2, wherein the gas distribution manifold includes a first plurality of outlets and a second plurality of outlets.

7. The liner assembly of claim 6, wherein the first plurality of outlets are disposed in a first plane and the second plurality of outlets are disposed in a second plane that is different than the first plane.

8. The liner assembly of claim 6, wherein the first plurality of outlets are formed in a surface of the gas distribution manifold having a first radius and the second plurality of outlets are formed in a surface of the gas distribution manifold having a second radius that is different than the first radius.

9. The liner assembly of claim 1, wherein the third liner comprises an exhaust liner.

10. A modular liner assembly for a substrate processing chamber, comprising:
    a first liner and a second liner, the first liner comprising an annular body having two recessed portions formed between a cut-out portion formed in the annular body; and
    a third liner comprising a body that is received in and at least partially contacts a portion of the recessed portions of the first liner.

11. The liner assembly of claim 10, wherein the third liner comprises one of a gas distribution manifold, a slit valve liner, or an exhaust insert liner assembly.

12. The liner assembly of claim 11, wherein the gas distribution manifold includes a first plurality of outlets and a second plurality of outlets, wherein the first plurality of outlets are disposed in a first plane and the second plurality of outlets are disposed in a second plane that is different than the first plane.

13. The liner assembly of claim 10, wherein the first liner and the second liner are disposed in a process volume of a chamber, and the body of the third liner includes a first end disposed in the process volume and a second end disposed outside of the chamber.

14. A process kit for a semiconductor processing chamber, comprising:
    a plurality of liners adapted to modularly couple to each other in a processing volume of a chamber, the plurality of liners comprising:
    a first liner and a second liner, each of the first liner and second liner comprising an annular body having a plurality of recessed portions formed therein; and
    at least a third liner comprising a body that is received in and at least partially contacts a portion of the plurality of recessed portions.

15. The process kit of claim 14, wherein the plurality of recessed portions comprise a first recessed portion and a second recessed portion.

16. The process kit of claim 15, wherein the first recessed portion is disposed opposite to the second recessed portion.

17. The process kit of claim 15, wherein the first recessed portion is disposed normal to the second recessed portion.

18. The process kit of claim 14, wherein the third liner comprises one of a gas distribution manifold, a slit valve liner, or an exhaust insert liner assembly.

19. The process kit of claim 18, wherein the gas distribution manifold comprises a plurality of first channels and a plurality of second channels.

20. The process kit of claim 19, wherein the plurality of first channels alternate with the plurality of second channels.

* * * * *